United States Patent
Yasuda et al.

(10) Patent No.: US 12,507,398 B2
(45) Date of Patent: Dec. 23, 2025

(54) SEMICONDUCTOR DEVICE AND SEMICONDUCTOR MEMORY DEVICE

(71) Applicant: Kioxia Corporation, Tokyo (JP)

(72) Inventors: Kasumi Yasuda, Kanagawa (JP); Hiroki Kawai, Aichi (JP)

(73) Assignee: Kioxia Corporation, Tokyo (JP)

( * ) Notice: Subject to any disclaimer, the term of this patent is extended or adjusted under 35 U.S.C. 154(b) by 393 days.

(21) Appl. No.: 18/177,060

(22) Filed: Mar. 1, 2023

(65) Prior Publication Data

US 2023/0413529 A1    Dec. 21, 2023

(30) Foreign Application Priority Data

Jun. 21, 2022 (JP) ............................. 2022-099395

(51) Int. Cl.
*H10B 12/00*    (2023.01)
(52) U.S. Cl.
CPC .................................. *H10B 12/33* (2023.02)
(58) Field of Classification Search
CPC .............................. H10B 12/33; H10B 41/70
See application file for complete search history.

(56) References Cited

U.S. PATENT DOCUMENTS

| | | | |
|---|---|---|---|
| 10,115,742 B2 | 10/2018 | Yamazaki | |
| 10,439,068 B2 | 10/2019 | Shimomura | |
| 2013/0306965 A1 | 11/2013 | Ahn | |
| 2019/0237581 A1* | 8/2019 | Saito | H10D 30/031 |
| 2021/0225847 A1* | 7/2021 | Wada | H10B 12/31 |
| 2022/0375939 A1* | 11/2022 | Sharma | H01L 21/0259 |

FOREIGN PATENT DOCUMENTS

| | | |
|---|---|---|
| JP | 2017085071 A | 5/2017 |
| JP | 2022020682 A | 2/2022 |

OTHER PUBLICATIONS

Hyun-Woo Park et al., "Device performance and bias instability of Ta doped InZnO thin film transistor as a function of process pressure", Applied Physics Letters 102, 102102, 2013, American Institute of Physics, 6 pages, https://doi.org/10.1063/1.4794941.

Shuai Lan et al., "Low-Temperature Deposited Highly Flexible In—Zn—V—O Transparent Conductive Electrode for Perovskite Solar Cells", ACS Applied Energy Materials, 2022, pp. 234-248, https://doi.org/10.1021/acsaem.1c02771?urlappend=%3Fref%3DPDF&jav=VoR&rel=cite-as.

Nobuyoshi Saito et al., "Origin of High Mobility in InSnZnO MOSFETs", Journal of the Electron Devices Society, 2018, vol. 6, https://doi.org/10.1109/JEDS.2018.2883651.

J.-P. Masse et al., "Stability and effect of annealing on the optical properties of plasma-deposited Ta2O5 and Nb2O5 films", Elsevier, Thin Solid Films 515, 2006, pp. 1674-1682, http://dx.doi.org/10.1016/j.tsf.2006.05.047.

(Continued)

*Primary Examiner* — Edward Chin
(74) *Attorney, Agent, or Firm* — Kim & Stewart LLP

(57) ABSTRACT

According to one embodiment, a semiconductor device includes a first electrode, a second electrode, a metal oxide semiconductor contacting the first electrode and the second electrode, a gate electrode, and an insulating film disposed between the metal oxide semiconductor and the gate electrode. The metal oxide semiconductor comprises indium, zinc, and niobium.

24 Claims, 2 Drawing Sheets

(56) References Cited

OTHER PUBLICATIONS

Todd M. Mcevoy et al., "Electrochemical Preparation of Molybdenum Trioxide Thin Films: Effect of Sintering on Electrochromic and Electroinsertion Properties", Langmuir, vol. 19, No. 10, 2003, pp. 4316-4326.
M. Deepa et al., "Electrodeposited tungsten oxide films: annealing effects on structure and electrochromic performance", Thin Solid Films, 468, 2004, pp. 32-42, https://doi.org/10.1016/j.tsf.2004.04.056.
S.K. Deb, Abstract of "Optical and photoelectric properties and colour centres in thin films of tungsten oxide", The Philosophical Magazine: A Journal of Theoretical Experimental and Applied Physics, Sep. 2, 2006, https://doi.org/10.1080/14786437308227562.
Manabu Ohkubo et al., "Preparation of conductive ReO3 thin films", Institute of Physics Publishing, Superconductor Science and Technology, 15, 2002, pp. 1778-1780, https://doi.org/10.1088/0953-2048/15/12/332.
Sanliang Ling et al., Reactivity of hydrogen and methanol on (0 0 1) surfaces of WO3, ReO3, WO3/ReO3 and ReO3/WO3, Catalysis Today 165, Issue 1, 2011, pp. 41-48, https://doi.org/10.1016/j.cattod.2011.01.017.
G.A. Battiston et al., "Chemical vapour deposition and characterization of gallium oxide thin films", Thin Solid Films, 279, 1996, pp. 115-118, https://doi.org/10.1016/0040-6090(95)08161-5.
A. Bouzidi et al., Effect of substrate temperature on the structural and optical properties of MoO3 thin films prepared by spray pyrolysis technique, Elsevier, Materials Science & Engineering B97, 2003, pp. 5-8, https://doi.org/10.1016/S0921-5107(02)00385-9.
Kenji Nomura et al., "Amorphous Oxide Semiconductors for High-Performance Flexible Thin-Film Transistors", Japanese Journal of Applied Physics, The Japan Society of Applied Physics, vol. 45, No. 5B, 2006, pp. 4303-4308, https://doi.org/10.1143/JJAP.45.4303.
R. Santos et al., "Thermoelectric properties of V2O5 thin films deposited by thermal evaporation", Elsevier, Applied Surface Science 282, 2013, pp. 590-594, https://doi.org/10.1016/j.apsusc.2013.06.016.
G. Ramirez et al., "Amorphous niobium oxide thin films", Journal of Non-Crystalline Solids 356, 2010, Elsevier, B.V., pp. 2714-2721, http://dx.doi.org/10.1016/j.jnoncrysol.2010.09.073.
R.M Fleming et al., "Defect dominated charge transport in amorphous Ta2O5 thin films", Journal of Applied Physics, vol. 88, No. 2, Jul. 15, 2000, https://doi.org/10.1063/1.373747.
Xue Huiwen et al, "An Overview of the Ultrawide Bandgap Ga2O3 Semiconductor-Based Schottky Barrier Diode for Power Electronics Application", Nanoscale Research Letters, 2018, pp. 1-13, https://doi.org/10.1186/s11671-018-2712-1.
Toshio Kamiya et al., "Material characteristics and applications of transparent amorphous oxide semiconductors", NPG Asia Materials, vol. 2, Jan. 2010, pp. 15-22, http://dx.doi.org/10.1038/asiamat.2010.5.

* cited by examiner

SEMICONDUCTOR DEVICE AND SEMICONDUCTOR MEMORY DEVICE

CROSS-REFERENCE TO RELATED APPLICATION(S)

This application is based upon and claims the benefit of priority from Japanese Patent Application No. 2022-099395, filed Jun. 21, 2022, the entire contents of which are incorporated herein by reference.

FIELD

Embodiments described herein relate generally to a semiconductor device and a semiconductor memory device.

BACKGROUND

Some semiconductor elements are formed from a metal oxide semiconductor material in some semiconductor devices and semiconductor memory devices.

DETAILED DESCRIPTION

Figure 1:
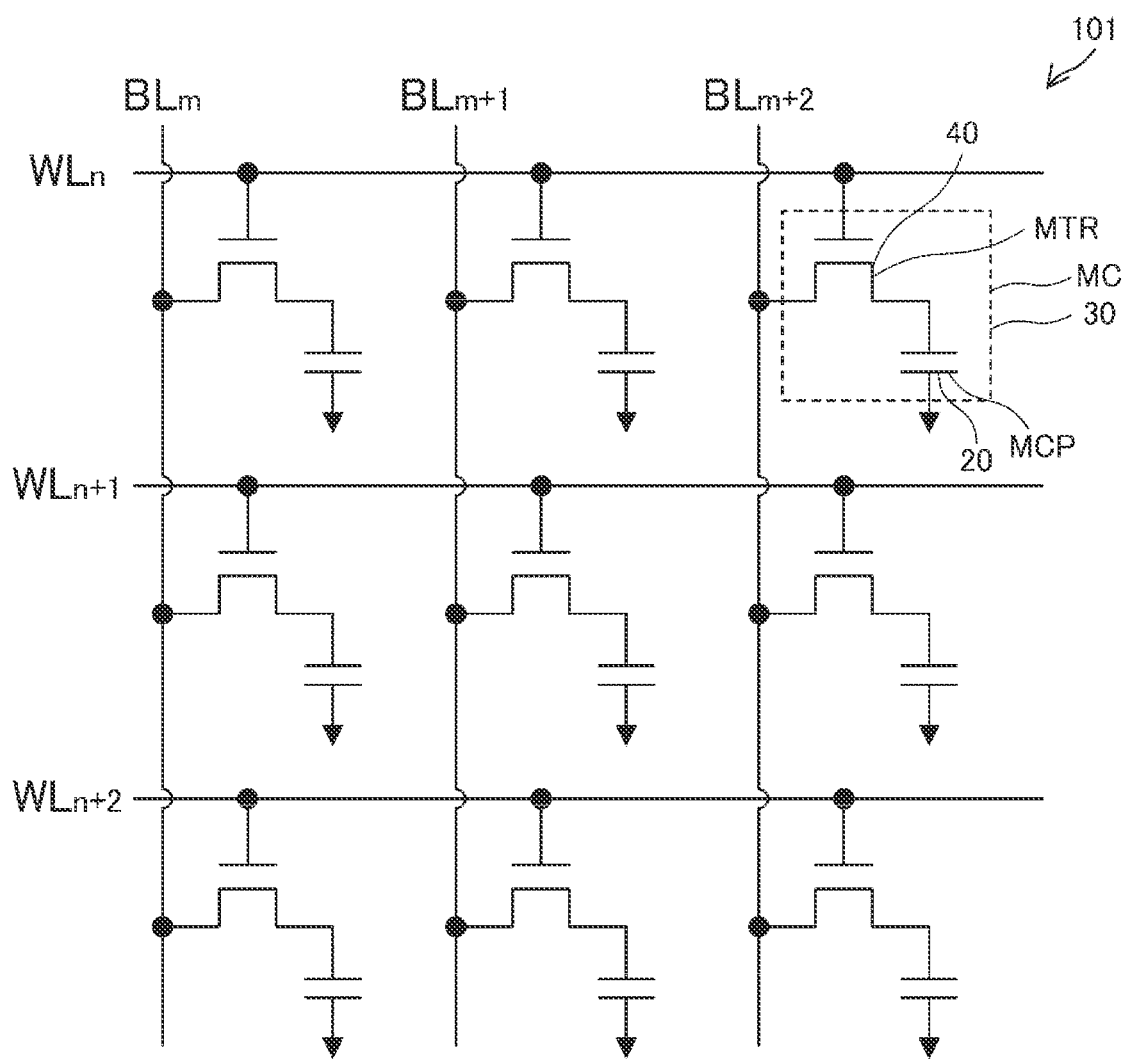
FIG. 1 is a circuit diagram of a memory cell array.

A material for a metal oxide semiconductor that easily control the amount of oxygen vacancy and the mobility of carriers in the metal oxide semiconductor regardless of the types of members to be connected to the metal oxide semiconductor is required.

Embodiments provide a semiconductor device and a semiconductor memory device that can stably control the amount of oxygen vacancy and improve the mobility of carriers.

In general, according to one embodiment, a semiconductor device includes a first electrode, a second electrode, a metal oxide semiconductor contacting the first electrode and the second electrode, a gate electrode, and an insulating film disposed between at the metal oxide semiconductor and the gate electrode. The metal oxide semiconductor comprises indium, zinc, and niobium.

In general, according to another embodiment, a semiconductor memory device includes a semiconductor device as described above, a first capacitor electrode connected to the second electrode, a second capacitor electrode facing the first capacitor electrode, and a dielectric film disposed between the first capacitor electrode and the second capacitor electrode.

Hereinafter, certain example embodiments will be described with reference to the accompanying drawings. In order to facilitate the understanding the description, in each drawing, the same components are denoted with the same reference symbols, and duplicated description will be omitted.

In the drawings, X, Y, and Z axes may be used. The X, Y, and Z axes form right-handed three-dimensional orthogonal coordinates. Hereinafter, the arrow direction of the X axis refers to a +X side (direction), and the direction opposite to the arrow direction refers to a −X side (direction). The same notational convention applies to the axes other than the X axis. Furthermore, in description the +Z side and a −Z side also refer to "upper side" and "lower side", respectively.

The term "connection" as used herein includes not only physical connection but also electric connection, and unless otherwise specified, includes not only direct connection but also indirect connection.

A semiconductor memory device 101 according to the embodiment is an oxide semiconductor-random access memory (OS-RAM) and includes a memory cell array.

As illustrated in FIG. 1, the memory cell array includes a plurality of memory cells MC, a plurality of word lines WL, and a plurality of bit lines BL.

FIG. 1 illustrates, as an example of the word lines WL, a word line $WL_n$, a word line $WL_{n+1}$, and a word line $WL_{n+2}$ (where n is an integer). FIG. 1 illustrates, as an example of the bit lines BL, a bit line $BL_m$, a bit line $BL_{m+1}$, and a bit line $BL_{m+2}$ (where m is an integer). The total number of the memory cells MC is not limited to the number illustrated in FIG. 1.

The memory cells MC are arranged, for example, in a matrix. Each of the memory cells MC includes a memory transistor MTR, which is a field effect transistor (FET), and a memory capacitor MCP.

A series of memory cells MC disposed along a row direction are connected to the same word line WL (e.g., word line $WL_n$) corresponding to a particular row (e.g., nth row) of the memory cell array. A series of memory cells MC disposed along a column direction are connected to the same bit line BL (e.g., bit line $BL_{m+2}$) corresponding to a particular column (e.g., (m+2)th column) of the memory cell array.

Specifically, a gate of the memory transistor MTR in each memory cell MC is connected to the same word line WL in each row. One of a source or a drain of each memory transistor MTR is connected to a bit line BL corresponding to a column.

One electrode of the memory capacitor MCP in the memory cell MC is connected to the other of the source or the drain of the memory transistor MTR in the memory cell MC. The other electrode in the memory cell MC is connected to a power supply line (not illustrated) for supplying a specific potential.

The memory cell MC is configured to store data by accumulating a charge in the memory capacitor MCP according to a current flowing through the corresponding bit line BL according to the switching state of the memory transistor MTR based on the potential of the corresponding word line WL.

Figure 2:
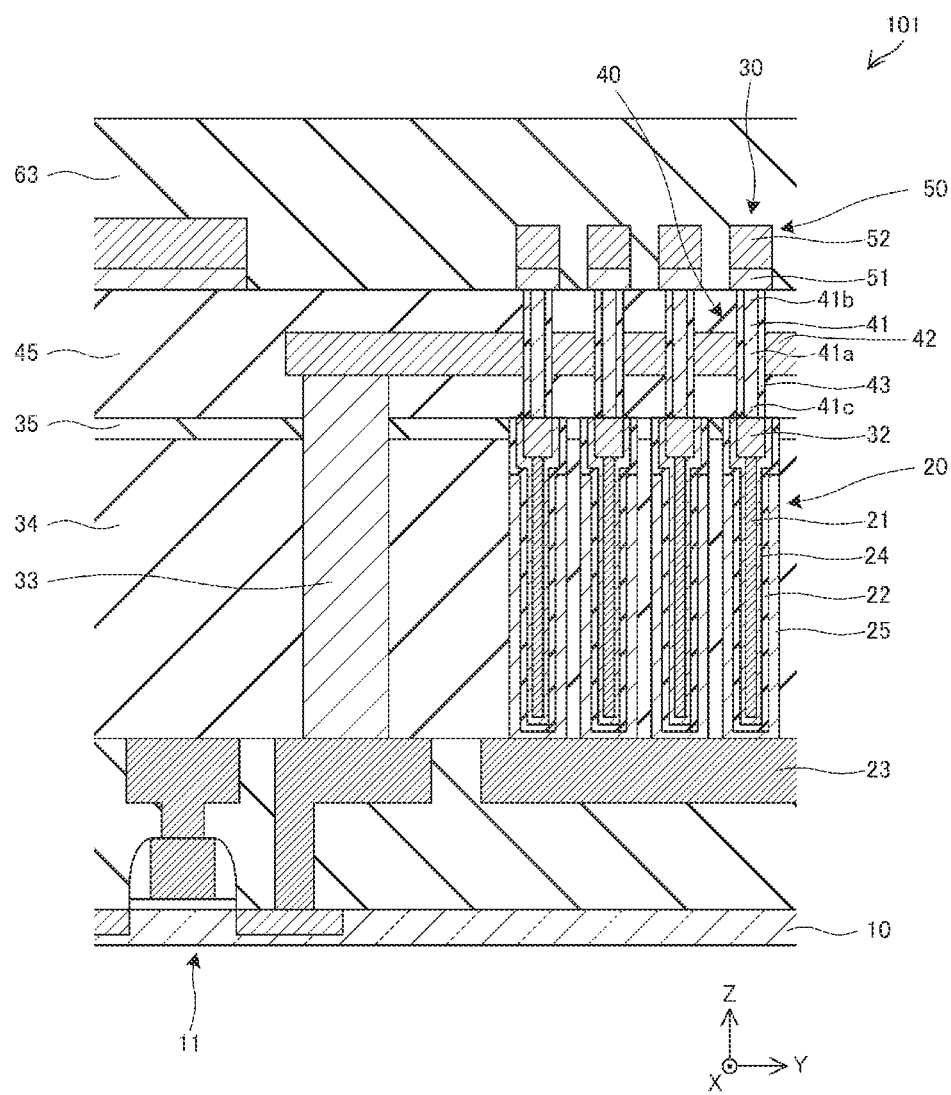
FIG. 2 is a schematic partial cross-sectional view illustrating a semiconductor memory device.

As illustrated in FIG. 2, the semiconductor memory device 101 includes a semiconductor substrate 10, a circuit 11, a capacitor 20, a semiconductor device 30, a conductor 33, and insulating layers 34, 35, 45, and 63.

The capacitor 20 includes an electric conductor 21, an insulating film 22 (dielectric film), a conductor 23, and electric conductors 24 (first capacitor electrode) and 25 (second capacitor electrode).

The semiconductor device 30 includes an field effect transistor 40 (semiconductor element), a conductive oxide layer 32 (second electrode), and a first electrode 50.

The field effect transistor 40 includes an oxide semiconductor layer 41 (metal oxide semiconductor), a conductive layer 42 (gate electrode), and an insulating layer 43 (insulating film). The first electrode 50 includes a conductive oxide layer 51 (first film) and a conductive layer 52 (second film).

The circuit 11 is a peripheral circuit such as a decoder circuit or the like for selecting a particular (e.g., an particularly addressed) memory cell MC from the memory cells MC in the semiconductor memory device 101, a sense amplifier connected to the bit line BL, a register including SRAM, or the like. The circuit 11 may include a CMOS circuit having an field effect transistor including a P-channel field effect transistor (Pch-FET) and an N-channel field effect transistor (Nch-FET) that are formed by a CMOS process.

The field effect transistor in the circuit 11 may be formed on a semiconductor substrate 10 such as a single crystal silicon substrate. The Pch-FET and the Nch-FET are so-called horizontal field effect transistors that have a channel region, a source region, and a drain region formed in the semiconductor substrate 10, and a channel for flowing carriers in the X-direction or Y-direction substantially parallel to the surface of the semiconductor substrate 10 at a region adjacent to the surface of the semiconductor substrate 10. The semiconductor substrate 10 may has a P-type or N-type conductivity type. FIG. 2 illustrates as a representative example just one field effect transistor as the circuit 11 for convenience, though, as described, a more complex circuit with additional elements may be provided.

The capacitor 20 is the memory capacitor MCP in the memory cell MC (see FIG. 1). FIG. 2 illustrates four capacitors 20, but the number of capacitors 20 is not limited to four.

In the present embodiment, the capacitor 20 is disposed above the semiconductor substrate 10 (above the surface of the semiconductor substrate 10). The electric conductor 24 (corresponding to the first capacitor electrode) in the capacitor 20 is connected to the conductive oxide layer 32. The electric conductor 25 (corresponding to the second capacitor electrode) in the capacitor 20 is opposite the electric conductor 24. The insulating film 22 is disposed between the electric conductor 24 and the electric conductor 25.

The capacitor 20 is a three-dimensional capacitor such as a pillar-type capacitor or a cylinder-type capacitor. The electric conductor 24 is disposed between the electric conductor 21 and the insulating film 22. The electric conductor 25 is disposed between the insulating film 22 and the insulating layer 34 and between the insulating film 22 and the conductor 23.

The electric conductor 21 may comprise a material such as amorphous silicon. The insulating film 22 may comprise a material such as hafnium oxide. The conductor 23, the electric conductor 24, and the electric conductor 25 may comprise a material such as tungsten (W) or titanium nitride (TiN).

The conductor 33 includes wiring that electrically connects the circuit 11 to the semiconductor device 30. The conductor 33 may incorporate so called "via wiring" which is vertical connections. For example, the conductor 33 includes a via wiring that extends in the Z-direction and connects a word line WL to the circuit 11 disposed on the semiconductor substrate 10 as shown in FIG. 2. For example, the conductor 33 comprises copper.

The insulating layer 34 is disposed between the adjacent capacitors 20. For example, the insulating layer 34 is a silicon oxide film.

The insulating layer 35 is disposed above the insulating layer 34. For example, the insulating layer 35 is a silicon nitride film.

The semiconductor device 30 is disposed above the capacitor 20. The conductive oxide layer 32 in the semiconductor device 30 is disposed above the electric conductor 21. The conductive oxide layer 32 comprises a metal oxide such as indium-tin-oxide (ITO).

The field effect transistor 40 corresponds to the memory transistor MTR in the memory cell MC. The field effect transistor 40 is disposed above the conductive oxide layer 32.

The oxide semiconductor layer 41 in the field effect transistor 40 is in direct contact with the first electrode 50 and the conductive oxide layer 32. The oxide semiconductor layer 41 is located in a direction farther away from the semiconductor substrate 10 than the conductive oxide layer 32 (corresponds to the +Z-direction, and may refer to upward). The first electrode 50 is located in a direction farther away from the semiconductor substrate 10 than the oxide semiconductor layer 41 (corresponds to the +Z-direction, and may refer to upward). The field effect transistor 40 is a so-called vertical transistor having a channel extending in the Z-direction (the first direction) substantially perpendicular to the surface of the semiconductor substrate 10.

The oxide semiconductor layer 41 is a column extending in the Z-direction. The oxide semiconductor layer 41 forms a channel of the field effect transistor 40. The oxide semiconductor layer 41 has an amorphous structure.

The oxide semiconductor layer 41 is a semiconductor material in which an oxygen vacancy acts as a donor. The oxide semiconductor layer 41 contains metal elements such as indium (In), zinc (Zn), niobium (Nb), and/or gallium (Ga). Specifically, in this example, the oxide semiconductor layer 41 is a semiconductor material in which an oxide of pentavalent niobium ($Nb_2O_5$) is mixed with an oxide of indium, gallium, and zinc, referred to as InGaZnO (IGZO).

The value obtained by dividing the atomic percent of gallium in the oxide semiconductor layer 41 by the total atomic percent of the metal elements (that is, in this example, the total atomic percent of indium, zinc, niobium, and gallium) is 0.25 or less. The value obtained by dividing the atomic percent of zinc in the oxide semiconductor layer 41 by the atomic percent of indium in the oxide semiconductor layer 41 is in a range of 0.15 to 0.75. The value obtained by dividing the atomic percent of niobium in the oxide semiconductor layer 41 by the total atomic percent of the metal elements (that is, in this example, the total atomic percent of indium, zinc, niobium, and gallium) in the oxide semiconductor layer 41 is 0.2 or less.

One end in the Z-direction (e.g., one of two end surfaces in the Z-direction) of the oxide semiconductor layer 41 is in contact with the first electrode 50, and the other end in the Z-direction (e.g., the other of the two end surfaces in the Z-axial direction) of the oxide semiconductor layer 41 is in contact with the conductive oxide layer 32. One end at the +Z side of the oxide semiconductor layer 41 is connected to the conductive layer 52 through the conductive oxide layer 51, and functions as one of a source or a drain of the field effect transistor 40. The other end at the −Z side of the oxide semiconductor layer 41 is connected to the conductive oxide layer 32, and functions as the other of the source or the drain of the field effect transistor 40. A side surface of the oxide semiconductor layer 41 may be in contact with at least one of the first electrode 50 or the conductive oxide layer 32.

The conductive oxide layer 32 is disposed between the electric conductor 21 in the capacitor 20 and the oxide semiconductor layer 41 in the field effect transistor 40, and functions as the other of a source electrode or a drain electrode of the field effect transistor 40. Since the conductive oxide layer 32 contains a metal oxide in a manner similar to the oxide semiconductor layer 41 in the field effect transistor 40, the contact resistance between the field effect transistor 40 and the conductive oxide layer 32 can be reduced.

The conductive layer 42 faces the oxide semiconductor layer 41. The insulating layer 43 is disposed between the oxide semiconductor layer 41 and the conductive layer 42. The conductive layer 42 is located in a second direction intersecting with the Z-direction from the oxide semiconductor layer 41. A first portion 41a disposed between the first electrode 50 and the conductive oxide layer 32 in the oxide semiconductor layer 41 is in contact with the insulating layer 43, and the insulating layer 43 is in contact with the conductive layer 42.

In the present embodiment, the conductive layer 42 extends in the Y-direction. The conductive layer 42 is superimposed on the oxide semiconductor layer 41 through the insulating layer 43 with respect to the XY plane. The conductive layer 42 functions as the gate electrode of the field effect transistor 40 as well as the corresponding word line WL. The conductive layer 42 comprises a metal, a metal compound, or a semiconductor material. For example, the conductive layer 42 comprises at least one material selected from the group consisting of tungsten, titanium (Ti), titanium nitride, molybdenum (Mo), cobalt (Co), and ruthenium (Ru). The conductive layer 42 is connected to the conductor 33.

The insulating layer 43 is disposed between the oxide semiconductor layer 41 and the conductive layer 42. The insulating layer 43 forms a gate insulating film of the field effect transistor 40. The insulating layers 43 comprise, for example, silicon oxide or silicon nitride.

The field effect transistor 40 is a so-called surrounding gate transistor (SGT) in which the gate electrode surrounds a channel. With the SGT design, the occupied die area of the semiconductor memory device can be reduced.

A field effect transistor having a channel layer comprising an oxide semiconductor material typically has an off-leakage current that is lower than a field effect transistor formed in the semiconductor substrate 10. Since the data stored in the memory cell MC can be stored for a long time, the number of refresh operations can be reduced. Additionally, since the field effect transistor having a channel layer containing an oxide semiconductor material can be formed in a low-temperature process, the application of thermal stress to the capacitor 20 can be reduced.

In the present example, the insulating layer 45 is disposed between a plurality of field effect transistors 40. For example, the insulating layer 45 is a silicon oxide film.

The first electrode 50 is in direct contact with the oxide semiconductor layer 41. The conductive oxide layer 51 in the first electrode 50 comprises indium, tin, and oxygen. Specifically, the conductive oxide layer 51 is an indium tin oxide (ITO). The conductive oxide layer 51 is in direct contact with the upper end surface of the oxide semiconductor layer 41.

The conductive oxide layer 51 functions as one of the source electrode or the drain electrode of the field effect transistor 40. Since the conductive oxide layer 51 contains a metal oxide like the oxide semiconductor layer 41, the contact resistance between the field effect transistor 40 and the conductive oxide layer 51 can be reduced.

The conductive layer 52 is disposed above at least one portion of the conductive oxide layer 51 and is in direct contact with the conductive oxide layer 51. The conductive layer 52 forms an electrode electrically connected to the bit line BL. The conductive layer 52 can be electrically connected to the sense amplifier in the circuit 11 through the bit line BL. The conductive layer 52 comprises a metal element. In the present embodiment, the conductive layer 52 is tungsten. In other examples, the conductive layer 52 may comprise a metal element other than tungsten.

In the present example, insulating layer 63 is disposed between stacked bodies containing the conductive oxide layer 51 and the conductive layer 52. For example, the insulating layer 63 is a silicon oxide film.

In a process for forming the semiconductor device 30, a heating treatment is performed in an oxidizing atmosphere, and as a result, oxygen can be introduced into the oxide semiconductor layer 41 through the conductive oxide layer 51. The oxidizing atmosphere contains, for example, oxygen, ozone, water vapor, or the like. Furthermore, a heating treatment may be performed in a nitrogen atmosphere. In the process for forming the semiconductor device 30, a heating treatment may be performed in a reductive atmosphere.

The conductive layer 52 contains reduced tungsten. Under a heating treatment of the oxide semiconductor layer 41, the conductive oxide layer 51, and the conductive layer 52, the tungsten contained in the conductive layer 52 may capture oxygen from ITO in the conductive oxide layer 51 and be oxidized by itself.

ITO in the conductive oxide layer 51 captures oxygen from IGZO in the oxide semiconductor layer 41, to produce an oxygen vacancy in the oxide semiconductor layer 41.

The oxygen vacancy in the oxide semiconductor layer 41 functions as a donor site. Therefore, when the oxygen vacancies are excessively produced in the oxide semiconductor layer 41, the electric properties of the oxide semiconductor layer 41 approach those of a metal and semiconductor properties may be lost. When the concentration of gallium in the oxide semiconductor layer 41 is increased, the oxygen vacancy is reduced due to strong bonding between gallium and oxygen. However, the mobility of carriers in the oxide semiconductor layer 41 is then reduced, which is also a problem.

The inventors have focused on strong electric attractions of high-valent metal cations, and conceived that a reduction in oxygen vacancy can be expected by positioning high-valent metal cations instead of gallium in IGZO or by adding high-valent metal cations to IGZO.

Specifically, high-valent metal cations such as vanadium (V), niobium, and tantalum (Ta) have been investigated for use as pentavalent metal cations, and molybdenum, tungsten, and rhenium (Re) have been investigated for use as hexavalent metal cations.

Among the high-valent metal cations, an oxide of rhenium is not preferred since this oxide is unstable due to sublimation. Molybdenum and tungsten easily form polycrystals since the crystallization temperatures of oxides thereof are low. When a polycrystal is formed, a grain boundary is randomly produced, resulting in a variance in resistance values of each channel. Therefore, vanadium, niobium and tantalum are preferred in this context since the crystallization temperatures of oxides thereof are higher than those of molybdenum and tungsten.

The crystallization temperatures of oxides of V, Nb, and Ta increase in the order of V, Nb, and Ta. The band gaps of the oxides of V, Nb, and Ta increase in the order of V, Nb, and Ta.

When vanadium is added, crystallization occurs at low temperature due to rearrangement of atoms of the oxide. This appears to provide weak bonding between vanadium and oxygen. Therefore, the oxygen vacancy is more easily produced in a metal oxide semiconductor doped with vanadium, and the electric properties of the metal oxide semiconductor approach those of a metal. In addition, the electric properties of the metal oxide semiconductor approach those of the metal due to a smaller band gap of the oxide when vanadium is added. Accordingly, the leak current in the metal oxide semiconductor may increase.

In contrast, when tantalum is added, the electric properties of the metal oxide semiconductor approach those of an insulator due to a larger band gap of the oxide when tantalum is added. Therefore, the mobility of carriers in the metal oxide semiconductor decreases.

When niobium is added into the metal oxide semiconductor, the metal oxide semiconductor can be easily converted into an amorphous structure due to high crystallization temperature. When such an amorphous structure is formed, the concerns related to variations in grain boundaries can be decreased. Therefore, the variation in electrical characteristic of each channel can be reduced.

Since the bonding between niobium and oxygen is strong, excessive production of oxygen vacancy can be prevented. When niobium is added, the band gap of the metal oxide semiconductor can be made an appropriate value such that the electric properties of the metal oxide semiconductor have favorable semiconductor properties. Therefore, a variation in electrical characteristic of each channel can be reduced, the amount of oxygen vacancy can be stably controlled, and the mobility of carriers can be improved.
Modification 1

The atomic percent of niobium in a second portion 41b (see FIG. 2) closer to the first electrode 50 than the first portion 41a of the oxide semiconductor layer 41 can be higher than the atomic percent of niobium in a third portion 41c (see FIG. 2) closer to the conductive oxide layer 32 than the first portion 41a.

When the atomic percent of niobium is increased at the second portion 41b near the conductive layer 52 containing W to more strongly bind to oxygen, significant extraction of oxygen at the second portion 41b can be effectively prevented by Nb. Therefore, oxygen vacancy can be reduced.

In an embodiment, the configuration in which IGZO is doped with Nb was described, but the disclosure is not limited to this configuration. The oxide semiconductor layer may have a configuration in which a binary oxide mixture of an oxide of indium ($In_2O_3$) and an oxide of zinc (ZnO), referred to as InZnO (IZO), that is doped with an oxide of Nb ($Nb_2O_5$). In this case, the value obtained by dividing the atomic percent of zinc in the oxide semiconductor layer 41 by the atomic percent of indium in the oxide semiconductor layer 41 is preferably in a range of 0.15 to 0.75. The value obtained by dividing the atomic percent of Nb in the oxide semiconductor layer 41 by the atomic percent of the metal elements (that is, the total atomic percent of indium, zinc, and niobium) in the oxide semiconductor layer 41 is preferably 0.2 or less.

In an embodiment, a configuration in which the field effect transistor 40 is a SGT is described, but the present disclosure is not limited to this configuration. The field effect transistor 40 may be another structure type such as a bottom gate structure.

In an embodiment, the field effect transistor 40 is used in an OS-RAM, but the present disclosure is not limited to this. The field effect transistor 40 can be incorporated into a semiconductor device other than OS-RAM.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first electrode;
a second electrode;
a metal oxide semiconductor contacting the first and second electrodes;
a gate electrode adjacent to the metal oxide semiconductor; and
an insulating film between the metal oxide semiconductor and the gate electrode, wherein
the metal oxide semiconductor comprises indium, zinc, and niobium,
the metal oxide semiconductor comprises a first portion adjacent to the gate electrode, a second portion between the first portion and the first electrode in the first direction, and a third portion between the first portion and the second electrode in the first direction, and
an atomic percent of niobium in the second portion is higher than an atomic percent of niobium in the third portion.

2. The semiconductor device according to claim 1, wherein
the metal oxide semiconductor extends in a first direction between the first electrode and the second electrode,
a first end of the metal oxide semiconductor in the first direction is in contact with the first electrode,
a second end of the metal oxide semiconductor in the first direction is in contact with the second electrode, and
the gate electrode is adjacent to metal oxide semiconductor along the first direction at a position between the first and second electrodes.

3. The semiconductor device according to claim 2, wherein
only the first end of the metal oxide semiconductor is in contact with the first electrode, and
only the second end of the metal oxide semiconductor is in contact with the second electrode.

4. The semiconductor device according to claim 1, wherein
the first electrode includes a first film and a second film,
the first film contacts the metal oxide semiconductor and comprises indium, tin, and oxygen, and
the second film contacts the first film on a side opposite the metal oxide semiconductor and comprises tungsten.

5. The semiconductor device according to claim 1, wherein the metal oxide semiconductor is an amorphous material.

6. A semiconductor device, comprising:
a first electrode;
a second electrode;
a metal oxide semiconductor contacting the first and second electrodes;
a gate electrode adjacent to the metal oxide semiconductor; and
an insulating film between the metal oxide semiconductor and the gate electrode, wherein
the metal oxide semiconductor comprises indium, zinc, and niobium, and
a value obtained by dividing an atomic percent of zinc in the metal oxide semiconductor by an atomic percent of indium in the metal oxide semiconductor is in a range of 0.15 to 0.75.

7. The semiconductor device according to claim 6, wherein
the metal oxide semiconductor further comprises gallium, and
a value obtained by dividing an atomic percent of gallium contained in the metal oxide semiconductor by an atomic percent of metal elements in the metal oxide semiconductor is 0.25 or less.

8. The semiconductor device according to claim 7, wherein a value obtained by dividing the atomic percent of niobium in the metal oxide semiconductor by the atomic percent of metal elements in the metal oxide semiconductor is 0.2 or less.

9. A semiconductor device, comprising:
a first electrode;
a second electrode;
a metal oxide semiconductor contacting the first and second electrodes;
a gate electrode adjacent to the metal oxide semiconductor; and
an insulating film between the metal oxide semiconductor and the gate electrode, wherein
the metal oxide semiconductor comprises indium, zinc, and niobium, and
a value obtained by dividing an atomic percent of niobium in the metal oxide semiconductor by an atomic percent of metal elements in the metal oxide semiconductor is 0.2 or less.

10. The semiconductor device according to claim 1, further comprising:
a semiconductor substrate, wherein
the second electrode is between the metal oxide semiconductor and the semiconductor substrate in the first direction.

11. A semiconductor memory device, comprising:
a semiconductor device according to claim 1; including:
a first electrode,
a second electrode,
a metal oxide semiconductor contacting the first and second electrodes,
a gate electrode adjacent to the metal oxide semiconductor, and
an insulating film between the metal oxide semiconductor and the gate electrode;
a first capacitor electrode connected to the second electrode;
a second capacitor electrode facing the first capacitor electrode; and
a dielectric film between the first capacitor electrode and the second capacitor electrode, wherein
the metal oxide semiconductor comprises indium, zinc, and niobium,
the metal oxide semiconductor comprises a first portion adjacent to the gate electrode, a second portion between the first portion and the first electrode in the first direction, and a third portion between the first portion and the second electrode in the first direction, and
an atomic percent of niobium in the second portion is higher than an atomic percent of niobium in the third portion.

12. The semiconductor memory device according to claim 11, wherein
the first electrode includes a first film and a second film,
the first film contacts the metal oxide semiconductor and comprises indium, tin, and oxygen, and
the second film contacts the first film on a side opposite the metal oxide semiconductor and comprises tungsten.

13. The semiconductor memory device according to claim 11, wherein the metal oxide semiconductor is an amorphous material.

14. A semiconductor memory device, comprising:
a semiconductor device including:
a first electrode,
a second electrode,
a metal oxide semiconductor contacting the first and second electrodes,
a gate electrode adjacent to the metal oxide semiconductor, and
an insulating film between the metal oxide semiconductor and the gate electrode;
a first capacitor electrode connected to the second electrode;
a second capacitor electrode facing the first capacitor electrode; and
a dielectric film between the first capacitor electrode and the second capacitor electrode, wherein
the metal oxide semiconductor comprises indium, zinc, and niobium, and
a value obtained by dividing an atomic percent of zinc in the metal oxide semiconductor by an atomic percent of indium in the metal oxide semiconductor is in a range of 0.15 to 0.75.

15. The semiconductor memory device according to claim 14, wherein
the metal oxide semiconductor further comprises gallium, and
a value obtained by dividing an atomic percent of gallium contained in the metal oxide semiconductor by an atomic percent of metal elements in the metal oxide semiconductor is 0.25 or less.

16. The semiconductor memory device according to claim 15, wherein a value obtained by dividing the atomic percent of niobium in the metal oxide semiconductor by the atomic percent of metal elements in the metal oxide semiconductor is 0.2 or less.

17. A semiconductor memory device, comprising:
a semiconductor device including:
a first electrode,
a second electrode,
a metal oxide semiconductor contacting the first and second electrodes,
a gate electrode adjacent to the metal oxide semiconductor, and
an insulating film between the metal oxide semiconductor and the gate electrode;
a first capacitor electrode connected to the second electrode;
a second capacitor electrode facing the first capacitor electrode; and
a dielectric film between the first capacitor electrode and the second capacitor electrode, wherein
the metal oxide semiconductor comprises indium, zinc, and niobium, and
a value obtained by dividing an atomic percent of niobium in the metal oxide semiconductor by an atomic percent of metal elements in the metal oxide semiconductor is 0.2 or less.

18. The semiconductor device according to claim 9, wherein
the metal oxide semiconductor extends in a first direction between the first electrode and the second electrode,
a first end of the metal oxide semiconductor in the first direction is in contact with the first electrode, a second end of the metal oxide semiconductor in the first direction is in contact with the second electrode, and the gate electrode is adjacent to metal oxide semiconductor along the first direction at a position between the first and second electrodes.

19. The semiconductor device according to claim 9, wherein the first electrode includes a first film and a second film, the first film contacts the metal oxide semiconductor and comprises indium, tin, and oxygen, and the second film contacts the first film on a side opposite the metal oxide semiconductor and comprises tungsten.

20. The semiconductor device according to claim 9, wherein the metal oxide semiconductor is an amorphous material.

21. The semiconductor memory device according to claim 11, wherein the metal oxide semiconductor extends in a first direction between the first electrode and the second electrode, a first end of the metal oxide semiconductor in the first direction is in contact with the first electrode, a second end of the metal oxide semiconductor in the first direction is in contact with the second electrode, and the gate electrode is adjacent to metal oxide semiconductor along the first direction at a position between the first and second electrodes.

22. The semiconductor memory device according to claim 17, wherein the metal oxide semiconductor extends in a first direction between the first electrode and the second electrode, a first end of the metal oxide semiconductor in the first direction is in contact with the first electrode, a second end of the metal oxide semiconductor in the first direction is in contact with the second electrode, and the gate electrode is adjacent to metal oxide semiconductor along the first direction at a position between the first and second electrodes.

23. The semiconductor memory device according to claim 17, wherein the first electrode includes a first film and a second film, the first film contacts the metal oxide semiconductor and comprises indium, tin, and oxygen, and the second film contacts the first film on a side opposite the metal oxide semiconductor and comprises tungsten.

24. The semiconductor memory device according to claim 17, wherein the metal oxide semiconductor is an amorphous material.

* * * * *